(12) United States Patent
Okatani et al.

(10) Patent No.: US 7,156,961 B2
(45) Date of Patent: Jan. 2, 2007

(54) SPUTTERING APPARATUS AND FILM FORMING METHOD

(75) Inventors: Kenji Okatani, Fuchu (JP); Satoshi Yamada, Fuchu (JP); Yoshiro Hasegawa, Tama (JP)

(73) Assignee: Anelva Corporation, Fuchu (JP)

( * ) Notice: Subject to any disclaimer, the term of this patent is extended or adjusted under 35 U.S.C. 154(b) by 52 days.

(21) Appl. No.: 10/278,783

(22) Filed: Oct. 24, 2002

(65) Prior Publication Data

US 2003/0079984 A1 May 1, 2003

(30) Foreign Application Priority Data

Oct. 30, 2001 (JP) ............................. 2001-333411

(51) Int. Cl.
*C23C 14/35* (2006.01)
(52) U.S. Cl. ..................... 204/192.2; 204/192.12; 204/298.09; 204/298.2; 204/298.23; 204/291.26; 204/298.28
(58) Field of Classification Search ........... 204/192.12, 204/192.2, 298.23, 798.26, 298.28, 298.2, 204/192.23, 192.26, 298.26, 298.09, 298.19; 118/724, 725
See application file for complete search history.

(56) References Cited

U.S. PATENT DOCUMENTS 3,616,451 A * 10/1971 Gallez ................... 204/298.26
3,945,903 A * 3/1976 Svendor et al. ........ 204/192.26
4,361,472 A * 11/1982 Morrison, Jr. ......... 204/192.12

(Continued)

FOREIGN PATENT DOCUMENTS

| EP | 1 029 941 A2 | 8/2000 |
| JP | 03-202468 | 4/1991 |
| JP | 03-134169 | * 6/1991 |
| JP | 03-134170 A | 7/1991 |

(Continued)

OTHER PUBLICATIONS

"Handbook od Deposition Technology for Films and Coatings", Bunshah, pp. 74, 1994.*

(Continued)

*Primary Examiner*—Rodney G. McDonald
(74) *Attorney, Agent, or Firm*—Buchanan Ingersoll & Rooney PC

(57) ABSTRACT

The present invention is to provide a sputtering apparatus and a thin film formation method which make it possible to form respective layers of a multilayer film having a clean interface at a optimum temperature, or which make it possible to continuously carry out the film formation and the surface processing. Another object of this invention is to provide a small sputtering apparatus for forming a multilayer film as compared with prior art apparatus. A sputtering apparatus of this invention comprises a main shaft around which at least one target and at least one surface processing mechanism are installed, a substrate holder holding a substrate or a plurality of substrates arranged facing the target and the surface processing mechanism, and a rotation mechanism to rotate the main shaft or the substrate holder.

17 Claims, 6 Drawing Sheets

U.S. PATENT DOCUMENTS

| | | | | |
|---|---|---|---|---|
| 4,858,556 A | * | 8/1989 | Siebert | 118/664 |
| 4,952,295 A | | 8/1990 | Kawabata et al. | |
| 5,112,673 A | * | 5/1992 | Sawada et al. | 428/216 |
| 5,674,366 A | | 10/1997 | Hayashi et al. | |
| 5,693,199 A | * | 12/1997 | Bourez et al. | 204/192.12 |
| 5,879,519 A | * | 3/1999 | Seeser et al. | 204/192.12 |
| 6,187,682 B1 | * | 2/2001 | Denning et al. | 438/694 |
| 6,328,856 B1 | * | 12/2001 | Brucker | 204/192.12 |
| 6,461,484 B1 | * | 10/2002 | Yo et al. | 204/192.12 |
| 6,641,702 B1 | * | 11/2003 | Shi et al. | 204/192.12 |

FOREIGN PATENT DOCUMENTS

| | | | |
|---|---|---|---|
| JP | 04-192289 A | | 10/1992 |
| JP | 04-311842 | | 11/1992 |
| JP | 06-116721 | * | 4/1994 |
| JP | 06-256098 | | 9/1994 |
| JP | 08-274142 | | 10/1996 |
| JP | 09-205092 | | 8/1997 |
| JP | 2002-020864 | | 1/2002 |
| JP | 2002-088471 | | 3/2002 |
| JP | 2002-167661 | | 6/2002 |

OTHER PUBLICATIONS

U.S. Appl. No. 10/205,604—"Multilayer Film Deposition Apparatus, and Method and Apparatus for Manufacturing Perpendicular Magnetic Recording Media".

U.S. Appl. No. 10/237,716—"Method of Production of Spin Valve Type Giant Magnetoresistive Thin Film".

Michael A. Kelly et al, "Diamond Growth by a New Method Based Upon Sequential Exposure to Atomic Carbon and Hydrogen", Applied Physics Letters; American Institute of Physics, New York, USA, May 18, 1992, vol. 60, No. 20, pp. 2502-2504.

Morimoto Akiyama et al, "Preparation of Highly Oriented ALM Thin Films on Glass Substrates by Helicon Plasma Sputtering and Design of Experiments", Thin Soild Films, No. 350, 1999, pp. 85-90, Elservier Science SA.

* cited by examiner (a)

(b)

(c)

(a)

(b)

(a)

(b)

(c)

(d)

SPUTTERING APPARATUS AND FILM FORMING METHOD

BACKGROUND OF THE INVENTION

1. Field of the Invention

The present invention relates to a sputtering apparatus and a thin film formation method, and in particular to a sputtering apparatus suitable for producing multilayer thin films having a clean interface.

2. Related Art

The area recording density of a magnetic disk has remarkably increased in recent years, and researches and developments are now made to realize the recording density of 100 Gbit/in$^2$. A magnetic recording medium is classified into a longitudinal (horizontal) magnetic recording and a perpendicular magnetic recording, and the former is now mainly adopted. The recording density of the longitudinal recording medium increases as the product of residual magnetic flux density (Br) and film thickness decreases, and therefore the film thickness has been made very thin in order to increase the recording density. However, since the crystal grain of a magnetic layer becomes smaller as the film is made thinner, thermal stability falls due to thermal fluctuation or thermal magnetization relaxation phenomenon which causes the super-paramagnetism transition in which the magnetization of micro magnets cannot be maintained at a room temperature. This is thought to be the limitation of the recording density of longitudinal magnetic recording media.

Accordingly, in order to break down the limitation due to the thermal stability and to realize higher recording density, the perpendicular magnetic recording media have been paid much attention and earnestly researched.

Both recording media usually comprise; a substrate made of glass, Al or the like, an underlying layer of NiP, NiAl or the like formed thereon in order to control the crystal orientation of a magnetic recording layer or to increase the mechanical strength of substrate when a soft substrate like Al substrate is used, single- or multi-recording layers, and a passivation layer. The multilayer film is generally formed using an in-line type manufacturing apparatus.

The in-line type manufacturing apparatus is composed of a load lock chamber to load and unload a substrate on/from a carrier, a pretreatment chamber to carry out cleaning or heat-processing of the substrate, an underlying layer forming chamber, a plurality of magnetic recoding layer forming chambers which have the number of sputtering chambers corresponding to the number of magnetic recording layers, and a passivation layer forming chamber. There is installed a gate valve between every two chambers. A transportation rail on which the carrier moves is built in every chamber. The substrates are held by the carrier and transported to each chamber one by one along the rail.

First, a plurality of substrates are loaded on the carrier in the load lock chamber and transported to the pretreatment chamber. In the pretreatment chamber, the substrate is heat-treated in order to remove contaminations such as water adhering to the substrate, or in order to make uniform the crystal orientation and the grain size of the underlying layer which affect the crystal growth of the magnetic recording layer and to optimize the coercive force of the magnetic recording layer. Moreover, in order to deposit the magnetic recording film at an optimum temperature, the substrates are heated to a temperature higher than the temperature for deposition, allowing in advance for the temperature drop during transportation. In the case of, for example, a CoCrPt magnetic recording film, the maximum coercive force(Hc) is obtained at the temperature range of 200–230° C. as is apparent from the graph of FIG. 7 which shows the relationship between the coercive force of film to be formed and the film forming substrate temperature. Therefore, the substrate is usually heated to 280° C. or less so that the substrates are in the above-mentioned temperature range when they are transported into the magnetic recording layer forming chamber, and that, in addition, the underlying layer such as NiP would not be magnetized. The substrate can also be cleaned by the sputter-etching there.

Then, the carrier is successively transported to the underlying layer forming chamber, one or more magnetic recording layer sputtering chambers, and the passivation layer forming chamber to form respective layers with a predetermined thickness on the substrates. After that, the carrier returns to the load lock chamber where the processed substrates are detached from the carrier and unprocessed substrates are loaded to the carrier.

Thus, a plurality of carriers are sent from and returned to the load lock chamber through the pretreatment chamber and the layer forming chambers to carry out the continuous production of magnetic recording media.

However, the method for forming a multilayer film by transporting the substrates to a plurality of chambers to form respective layers is disadvantageous that the residual gas in a vacuum adsorbs on the film surface during the substrate transportation and deteriorates magnetic characteristics as a result of the impurities mixing and the oxide layer formation at the interface.

In the case of the multilayer film of very thin layers, especially such as a magnetic recording film composed of repetitions of bilayer of Co and Pd in which each layer has a thickness of 1 nm or less, the residual gas influences remarkably the characteristics, which may make it impossible to obtain desired magnetic characteristics. In the case of, e.g., CoCr longitudinal magnetic recording media, it was found that adsorbed gas made the crystal grain of the film deposited thereon finer, and diffused into the magnetic recording layer to decrease the coercive force since the formation of the magnetic isolation structure of the crystal grains which is necessary for the noise reduction and which is attributed to the Cr segregation to the grain boundary is inhibited.

Furthermore, the disadvantage of the temperature drop during the substrate transportation cannot be avoided, and therefore it is difficult to set the substrate temperature at an optimum value in respective film forming chambers. That is, in order to manufacture a magnetic recording medium having higher characteristics, each magnetic recording layer should be formed at an optimum temperature for various materials and constructions of the film. However, it was difficult to meet such demands with prior art apparatuses.

In the case of forming multilayer films composed of tens of layers such as a Co/Pd multilayer magnetic film, the substrates are transported to many process chambers. As a result, the surface is contaminated with residual gas during transportation. In addition, a huge floor space is requested for the apparatus since its size is extremely increased.

Although the disadvantages of prior art apparatus and film forming method have been described for the magnetic disks as an example, similar problems are also anticipated to occur for a variety of elements or devices using magnetic thin films such as a magneto-resistive (MR) head for read/write operation, and multilayer devices or elements composed of various materials other than magnetic materials.

SUMMARY OF THE INVENTION

Under such circumstances, an object of this invention is to provide a sputtering apparatus and a thin film formation method which make it possible to form respective layers of a multilayer film having a clean interface at a optimum temperature, or which make it possible to continuously carry out the film formation and the surface processing. Another object of this invention is to provide a small sputtering apparatus for forming a multilayer film as compared with prior art apparatus.

A sputtering apparatus of this invention, accomplished by overcoming above-mentioned problems, comprises a main shaft around which at least one target and at least one surface processing mechanism are installed, a substrate holder holding a substrate or a plurality of substrates arranged facing the target and the surface processing mechanism, and a rotation mechanism to rotate the main shaft or the substrate holder.

With this configuration, it becomes possible to perform the surface processing of substrates and the thin film formation simultaneously or continuously in one process chamber. Therefore, the film can be formed on a clean surface and on a surface suitable for desired film characteristics. This makes it possible to form a variety of high quality functional thin films having clean interfaces. By installing, e.g., a substrate heat-treatment mechanism, the film formation can be carried out at an optimum temperature for obtaining predetermined characteristics because the substrate can be heated to any temperature suitable for the film formation, unlike the prior art in-line type apparatus in which the substrate should be overheated to the higher temperature than the film forming temperature allowing in advance for the temperature drop during the transportation.

Furthermore, the smaller and less expensive apparatus used for forming multilayer films can be realized since the multilayer film can be formed in one process chamber by arranging a plurality of targets around the main shaft.

Here, the center of each substrate is preferably arranged to be located on a circumference so as to overlap with said target when said main shaft or said substrate holder is rotated. With this configuration, electric power may be supplied to a plurality of targets to discharge simultaneously. Thus, a multilayer film having the same number of layers as that of targets can be formed during one revolution of the main shaft or substrate holder. The rotation speed and the electric power fed to the target should be adjusted depending on the material and thickness of the layer. It is also possible to discharge one target at a time in this case, and then discharge another target after the film with a predetermined thickness is formed. Furthermore, the surface processing and the thin film formation may be made at the stationary state of main shaft.

Although the substrate centers are preferably placed on the same circumference as mentioned, the respective substrate centers can also be placed on the different circumferences. Similarly, the targets and the surface processing mechanisms can be attached so that the centers are located on different circumferences.

In contrast, when one substrate is mounted on a holder, the center of the substrate is not necessarily coincident with the center axis of the main shaft. That is, the center of substrate can be located away from the center axis. In these cases, at least the target is preferably installed to be tilted toward the center axis. This configuration improves the film formation rate and the utilization rate of the target.

In this invention, a partition is preferably mounted between said target and said surface processing mechanism, which prevents mutual interference and mutual contamination. As a result, the stable processing can be maintained and the maintenance period can be extended.

In addition, the sputtering apparatus further comprises a magnet unit installed behind said target for generating magnetron electric discharge by forming magnetic field over the surface of said target, and a rotation mechanism to make said magnetic unit turn on its own axis together with or independently of said main shaft. The film formation rate increases with this configuration, which increases the degree of freedom in manufacturing various multilayer films having various construction. The utilization rate of target is also improved.

A heat-treatment mechanism, an ion irradiation mechanism, or a plasma processing mechanism is preferably used as the surface preparation mechanism of this invention.

A thin film forming method of this invention comprises the step of fixing at least one target and at least one surface processing mechanism around a main shaft and installing said main shaft in a vacuum chamber, and the step of carrying out a film formation and a surface processing on a substrate or a plurality of substrates arranged facing the said target and said surface processing mechanism at the stationary or rotational state of said main shaft.

Figure 1:
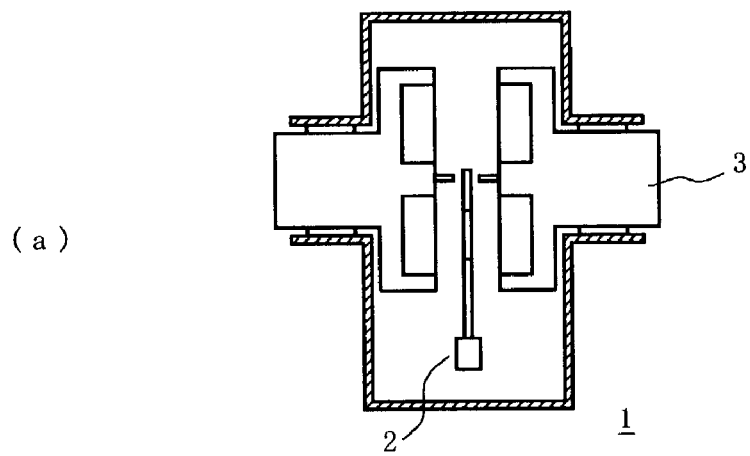
FIG. 1 is a schematic view showing the sputtering apparatus of the first embodiment.
Figure 1:
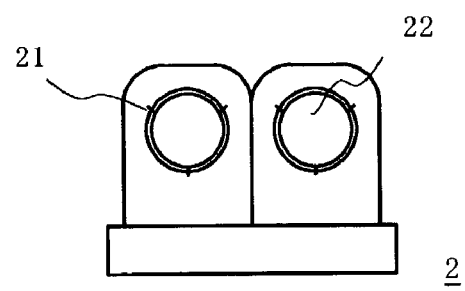
Figure 1:
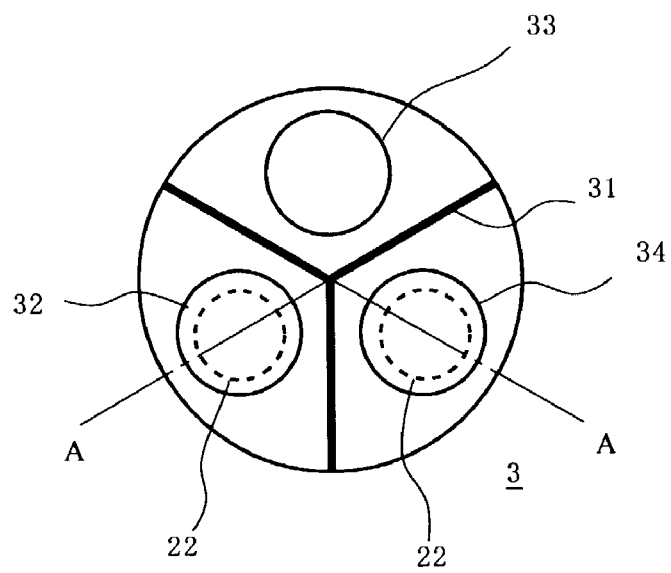

In these drawings, numeral 1 denotes sputtering chamber; 2, carrier; 3, rotation cathode unit; 11, sidewall of sputtering chamber; 12, cylindrical attachment frame; 13, magnetic fluid sealing; 14, bearing; 16, cylindrical member; 17, motor; 18, first gear; 19, third gear; 21, support click; 22, substrate; 30, rotation shaft (main shaft); 31, partition; 32, 33, target; 34, lamp heater; 35, backing plate; 36, coolant channel formation plate; 37, insulator; 39, disk-shaped member; 40, cylindrical outer frame; 41, center magnet; 42, circumference magnet; 43, yoke; 44, fourth gear; 45, magnet unit center axis; 46, bearing; 47, second gear; 49, slip ring; 50, rotary joint; 51, coolant channel; 61, heat treatment mechanism; 62, ion irradiation mechanism; 63, ion gun; 64, gas ejection tube.

DETAILED DESCRIPTION OF THE INVENTION

The embodiments of this invention are explained by referring to the drawings.

Figure 2:
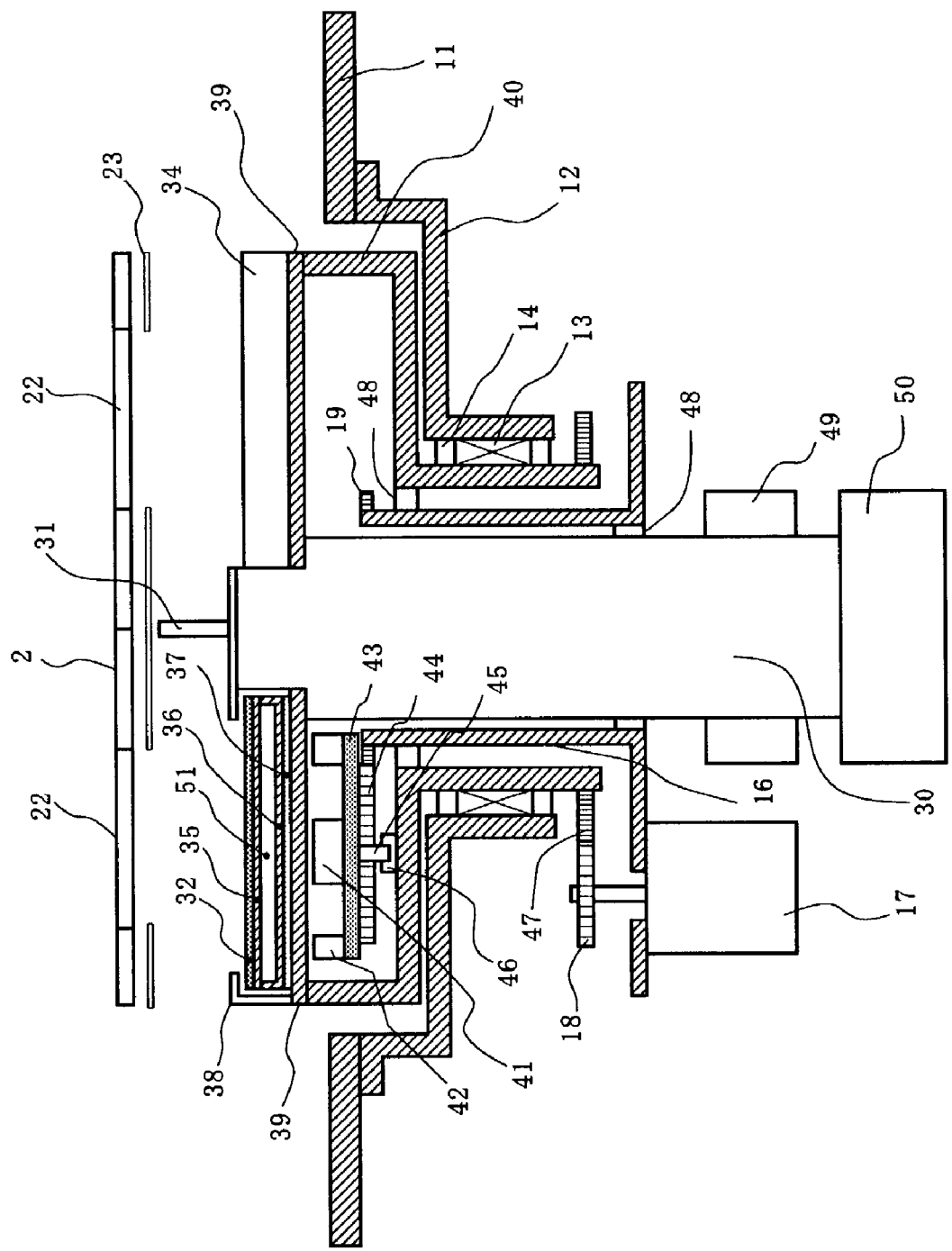
FIG. 2 is a sectional view showing the rotation cathode unit of the sputtering apparatus.
Figure 5:
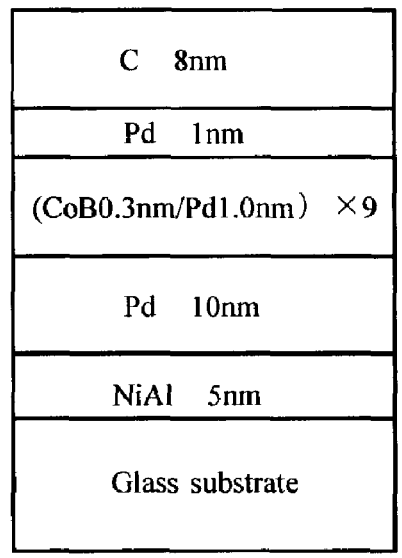
FIG. 5 are schematic views showing the constructions of various multilayer films.
Figure 5:
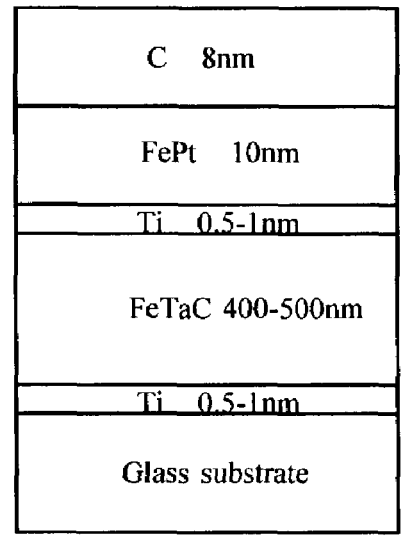
Figure 5:
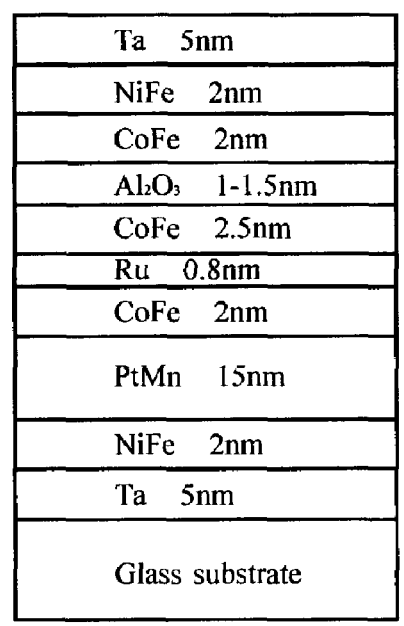
Figure 5:
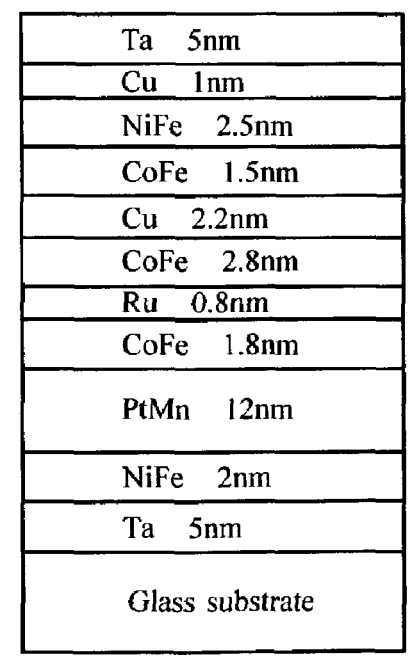

The first embodiment of this invention refers to a sputtering chamber shown in FIGS. 1 and 2 which is used for the formation of a Co/Pd magnetic multilayer film of perpendicular magnetic recording medium shown in FIG. 5 (a). FIG. 1(a) is a schematic cross-sectional view showing a sputtering chamber, seen from the substrate transportation direction. As shown in the drawing, a rotation cathode unit 3 is rotatably installed on each of two sidewalls of the sputtering chamber 1 to cause electric discharge on both sides of a carrier 2 which holding two substrates. Thus, the multilayer film can be simultaneously formed on both sides of substrate.

The substrate 22 is supported with, for example, three support clicks 21 on carrier 2. The carrier is transported to process chambers by the well-known transportation mechanism as is shown in FIG. 1 (*b*). The transportation mechanism using, for example, a magnetic coupling disclosed in JP10-159934A is preferably employed. This transportation mechanism is composed of a carrier having a number of small perpendicularly magnetized magnets arranged on the bottom along the transportation direction so that the magnetization direction of magnets is alternately reversed, and rotation rollers arranged along the transportation direction, which has a plurality of helical magnets on the periphery. The carrier is floated and transported over along the rollers by rotating the rollers.

FIG. 1(*c*) is a plan view of rotation cathode unit 3, seen from the substrate position. A CoB target 32, a Pd target 33, and a lamp heater (heat treatment mechanism) 34 for heating the substrates are mounted concyclically around the rotation center of the rotation cathode unit 3. Specifically, for, e.g., 2.5 inch substrate, targets having a diameter of 90 mm are attached so that their centers are on the circumference of radium of 74 mm. The substrates are also attached on the carrier so that the centers lie on the circumference of the same radium and the target passes over the whole substrates. Between every two of targets 32 and 33 and heat treatment mechanism 34, a partition plate 31 is mounted in order to prevent the mutual interference and mutual contamination. The configuration and mechanism of the rotation cathode unit are explained with reference to FIG. 2 which is a cross-sectional view along A—A line of FIG. 1(*c*).

The rotation cathode unit 3 of this embodiment is rotatably installed to a cylindrical attachment frame 12 having a step portion through a magnetic fluid sealing 13 and bearing 14. The frame 12 is fixed on the sidewall 11 of sputtering chamber. The rotation cathode unit is composed of; a disk-shaped member 39 on which targets 32, 33 and the heat treatment mechanism 34 are fixed; a rotation shaft 30 to fix member 39; a cylindrical outer frame 40 fixed to the perimeter part of disk-shaped member 39 so as to surround rotation shaft 30; and a motor 17 for rotating outer frame 40. The magnetic fluid sealing 13 is placed between cylindrical outer frame 40 and cylindrical attachment frame 12. A second gear 47 is attached on cylindrical outer frame 40 to engage with a first gear 18 fixed to the revolving shaft of motor 17.

The target 32 is stuck on a backing plate 35, and is fixed on disk-shaped member 39 through a coolant channel formation plate 36 and an insulator 37. The coolant channel formation plate 36 is connected with a slip ring 49 which is connected with an external electric power source (not illustrated), to feed electric power to the revolving target. The slip ring of, for example, φ 150–60, 3chSR (GLOBETECH INC.) can be used Moreover, the coolant channel 51 formed between coolant channel formation plate 36 and backing plate 35 is connected with a rotary joint 50 through a coolant supply pipe and an exhaust pipe (not illustrated) to cool the revolving target by circulating coolant with a thermostatic bath (not illustrated). As the rotary joint 50, a Rotary joint KT-4-02-1W (KOYOYUATSU) is, for example, used.

In addition, a shielding 38 of the ground potential is mounted so as to cover the target perimeter, the backing plate, and the side face of the coolant channel formation plate.

The magnet unit composed of a central magnet 41, a circumference magnet 42 and a yoke 43 is arranged on the plateau portion of cylindrical outer frame 40 behind the target, and its center axis 45 is rotatably supported with a bearing 46. Furthermore, a fourth gear 44 is attached on the yoke base to be engaged with a third gear 19 mounted on the tip portion of cylindrical member 16 which is installed between cylindrical outer frame 40 and rotation shaft 30. Therefore, when motor 17 is rotated, cylindrical outer frame 40 will rotate with the aid of first gear 18 and second gear 47 (namely, the target and the magnet unit revolve around the rotation shaft), and the magnet unit will also rotate with the aid of third gear 19 and fourth gear 44. Here, a cylindrical member 16 is fixed to the rotation shaft 30 and cylindrical outer frame 40 through bearings 48.

The ring-shaped parallel magnetic field is generated over the target surface with the magnet unit to cause magnetron electric discharge. Moreover, since central magnet 41 and circumference magnet 42 are asymmetrically arranged to the center 45, the ring-shaped magnetic field over the target surface is also asymmetrical. For this reason, the ring-shaped magnetic field can also move over the whole target surface when the magnet unit rotates, meaning that the whole surface of target will be uniformly sputtered. This extends the lifetime of target and improves the film thickness uniformity of the thin film formed on the substrate.

In addition, a lamp heater 34, heat treatment mechanism, is also attached on the disk-shaped member 39 and is connected with an external power source (not illustrated) through slip ring 49 in the same manner as the target.

Next, the film forming procedure will be explained to form the Co/Pd multilayer film on the substrate when the carrier holding the substrates is transported into sputtering chamber 1.

The gate valve of sputtering chamber is opened and the carrier holding two substrates on which the NiAl underlying layer have been formed is transported into the sputtering chamber. The carrier is stopped when the carrier center comes to the center position of the rotation cathode unit and the gate valve is closed. A shielding plate 23 having openings over substrate positions is mounted over the carrier to prevent the film deposition on adjacent substrate and on the chamber wall. The spacing between shielding plate 23 and partition plate 31 is adjusted not to come in contact with each other, and is usually set to about 3–10 mm.

The rotation cathode unit is rotated at a speed of, e.g., 60 rpm, the electric power of 300 W is supplied to the lamp heater such as φ 80, 2 kW circle heater (Daiken DENKI Co., Ltd) to heat the substrates to 70–100° C. for about 4 seconds, and then the electric power is cut off. The temperature is set to 70–100° C. for the formation of the super lattice film since the mixing occurs between layers when heated to higher temperature. Then, Ar gas is introduced to 10 Pa from a gas introduction mechanism (not illustrated).

A DC electric power of 350 W is fed to the Pd target to form Pd layer with a thickness of 10 nm on the substrate. Next, a DC electric power of 400 W is fed to the CoB target. The formation of bilayer of CoB (0.3 nm) and Pd (1.0 nm) is continuously repeated nine times to produce the super lattice film. Then, the electric power supply to the CoB target is cut off, and the 1.0 nm thick Pd layer is formed thereon. Then, electric power and gas introduction are also cut off. After the chamber is evacuated to a predetermined degree of vacuum, the gate valve between sputtering chamber and the passivation layer forming chamber is opened to send the carrier out. A carbon passivation film with s thickness of 8.0 nm is deposited in the passivation layer forming chamber. Thus, the carrier was passed around to carry out prescribed process on substrates in respective chambers, which makes it possible to continuously manufacture high quality magnetic media having impurity free, clean interfaces.

The magnetic media having a Co/Pt multilayer film can also be manufactured to have high magnetic characteristics in the same way as the Co/Pd multilayer film.

The following configurations similar to that shown in FIG. 1 are also available. That is, the Co and Pt targets can be attached on the different circumference from the lamp heater. The center of the circumference on which the substrates are placed may be displaced from the center axis of rotation shaft, which may in some case improves the uniformity of film thickness.

As the second embodiment of this invention, the sputtering chambers are explained, which are used for the formation of underlying and soft magnetic layers (Ti/FeTaC/Ti), and recording layers (Fe/Pt) of magnetic medium shown in FIG. 5(b).

Figure 3:
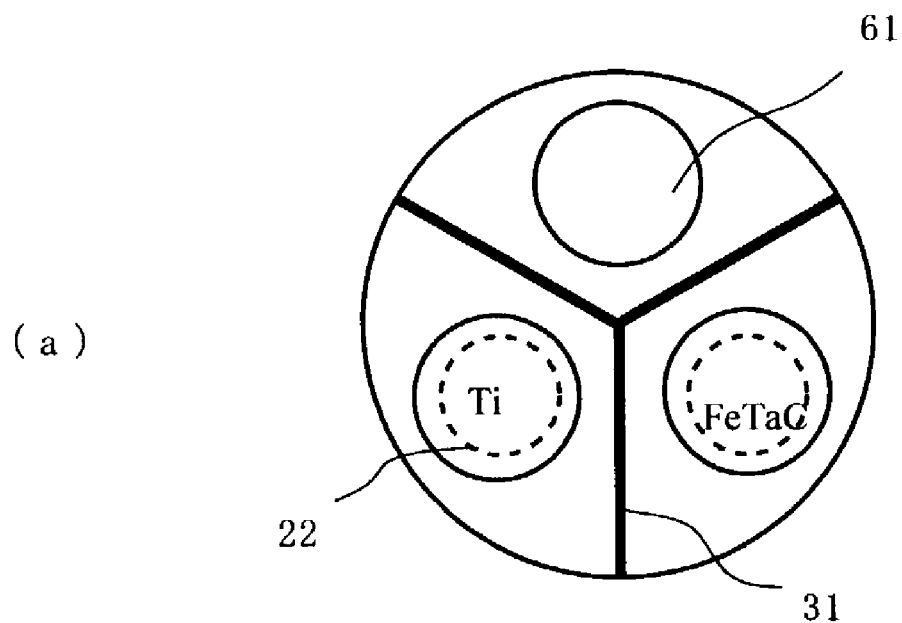
FIG. 3 is a schematic view showing the rotation cathode unit of the second embodiment.
Figure 3:
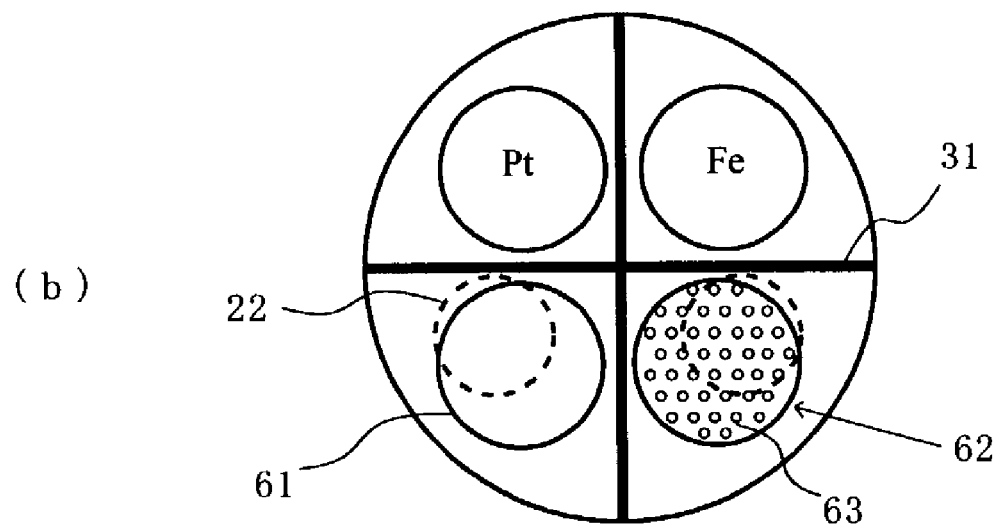

The underlying and soft-magnetic layer forming chamber and the magnetic recording layer forming chamber are nearly the same as that shown in FIGS. 1 and 2, except for the configuration of target and processing mechanism of the rotation cathode unit. The rotation cathode units of the underlying and soft-magnetic layer forming chamber and the magnetic recording layer forming chamber are shown in FIGS. 3(a) and (b), respectively.

A Ti target for forming underlying layer, a FeTaC target for forming soft magnetic layer (under layer) to shunt the magnetic field from magnetic recording layers, and heat treatment mechanism 61 are attached on the rotation cathode unit of the underlying and soft-magnetic layer forming chamber.

An ion irradiation mechanism 62 for cleaning and flattening Ti layer surface, a heat-treatment mechanism 61, a Fe target, and a Pt target are attached on the rotation cathode unit of the magnetic recording layer forming chamber. As the ion irradiation mechanism 62, the one composed of a number of ion guns 63, such as a Multi-cell ion beam source MCIS -12A (ADVANTEST ENERGY) is preferably employed to uniformly irradiate ions on the substrate surface. Moreover, a plasma processing mechanism can be employed instead of an ion irradiation mechanism.

When the carrier on which the substrates are loaded in the load lock chamber is transported into the underlying and soft-magnetic layer forming chamber, the rotation cathode unit is rotated, the sputtering gas such as Ar is introduced, and the electric power is supplied to the heat treatment mechanism. After the substrates are heated to 70–100° C., an electric power is fed to the Ti target to form Ti film with a predetermined thickness. The electric power is cut off to Ti target. Instead, the electric power is fed to the FeTaC target to form a soft magnetic layer with a predetermined thickness. After the upper Ti layer is similarly formed, all electric power supply and gas supply are cut off. Then, the carrier is transported to the magnetic recording layer forming chamber.

When the carrier is transported into the magnetic recording layer forming chamber, the rotation cathode units start rotating. Then, the ion guns and the heating mechanisms are driven. The ions emitted from the ion guns remove the residual gas adhering on the surface of Ti film formed on the substrate and flatten the Ti atom surface to form clean, flat Ti layer with a thickness of 0.5–1 nm.

After the substrates are heated to about 400° C., the electric power is fed to Fe target and Pt target to start electric discharge and form the perpendicular magnetic film of FePt alloy.

The carrier is further transported to a passivation layer forming chamber to form a carbon passivation layer. Then, the carrier returns to the load lock chamber, in which the processed substrates are dismounted from and new substrates are mounted on the carrier to repeatedly carry out above-mentioned procedures.

The FePd film can also be manufactured in the same way as FePt film.

Figure 4:
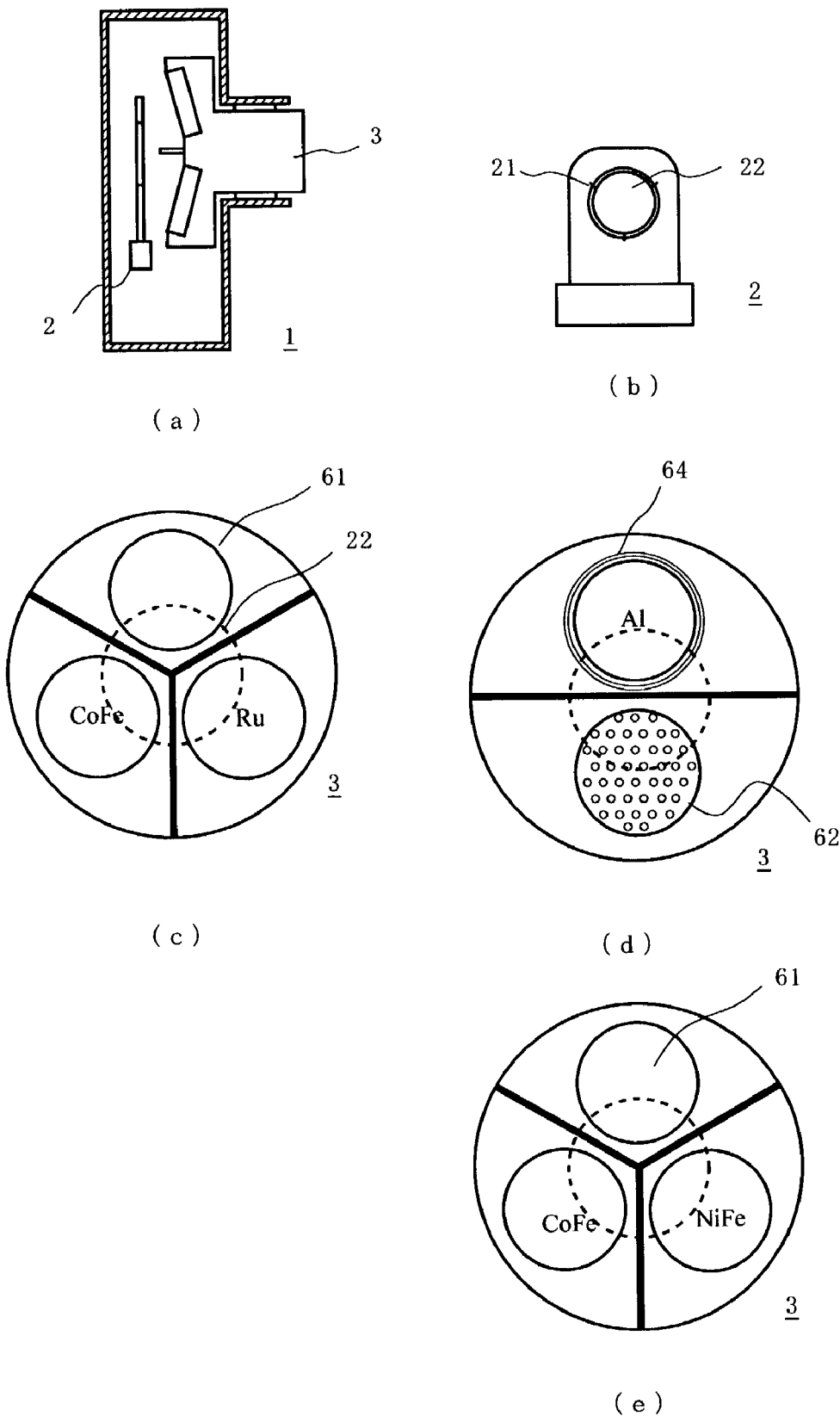
FIG. 4 is a schematic view showing the sputtering apparatus of the third embodiment.

Next, the third embodiment of this invention is shown in FIG. 4.

FIG. 4 is a schematic view showing a sputtering chamber preferably used for forming a TMR (Tunneling magnetoresistive) film of the non-volatile magnetoresistive random access memory (MRAM) using the magneto-resistance effect.

As shown in FIG. 5(c), a multilayer TMR film is composed of ferri-type pinned layers of CoFe/Ru/CoFe, free layers of NiFe/CoFe, and a barrier (insulator) layer of $Al_2O_3$ or the like sandwiched between them. The surface uniformity of lower layer (CoFe) greatly influences the barrier characteristics because the barrier layer is so thin as 1–1.5 nm. That is, the cleanness and uniformity of the lower layer surface is very important.

In the sputtering chamber shown in FIG. 4(a), the film formation is started when the center of the substrate 22 attached on carrier 2 comes to the position of the rotation cathode unit center. In the case where the film formation is made after the center of substrate 22 is made in agreement with the center of rotation cathode unit 3, it is preferable as shown in FIG. 4(a) to attach the target and the substrate processing mechanism on rotation cathode unit inclined by a prescribed angle (for example, 20 degrees) to the substrate. The film formation rate and the ratio of target utilization are improved as compared with the case where the target is attached parallel with the substrate. Moreover, since the TMR film is formed on one side of substrate in this embodiment, the rotation cathode unit is installed to only one sidewall of the sputtering chamber 1.

FIGS. 4(c)–(e) are plan views of rotation cathode unit in the sputtering chambers for forming the pinned layers, the barrier layer, and the free layers, respectively. That is, as shown in FIG. 4(c), a CoFe target, a Ru target, and a heat-treatment mechanism 61 are attached on the rotation cathode unit for the formation of the pinned layers. Similarly, an Al target and an ion irradiation mechanism 62 are attached on the rotation cathode unit for the barrier layer film formation. Here, a ring-shaped $O_2$ gas ejection tube 64 having a large number of gas outlets is arranged so as to surround the Al target (FIG. 4(d)). A CoFe target, a NiFe target, and a heat-treatment mechanism 61 are attached on the rotation cathode unit for the formation of the free layers (FIG. 4(e)).

The carrier holding the substrate on which a Ta buffer layer, a NiFe seed layer, and a PtMn anti-ferromagnetic layer have already been formed is transported into a pinned layer forming sputtering chamber, and stops at the position where the substrate center comes to the center of rotation cathode unit. The rotation cathode unit begins rotating. Then, Ar gas is introduced and electric power is supplied to the heat treatment mechanism 61 in order to heat the substrate up to a predetermined temperature to remove the residual gas adsorbed on the surface. Then, electric power is fed to one target at a time to cause discharge and form the layers having a predetermined thickness in the order of CoFe/Ru/CoFe.

Then, the carrier is transported to the sputtering chamber for barrier layer after the pinned layers are formed. Here, Ar ions are first irradiated on the substrate surface from the ion guns to clean and flatten the CoFe film. Then, Ar gas is introduced and $O_2$ gas is also introduced from $O_2$ gas ejection tube to form $Al_2O_3$ film on the CoFe film. Thus, since the CoFe film surface is flattened before $Al_2O_3$ insulating layer formation, the very thin and flat $Al_2O_3$ film having high dielectric characteristics can be uniformly formed, which improves the tunnel effect between upper and lower layers. It is also possible to employ $SiO_2$ instead of the $Al_2O_3$ insulating film. Although the surface is flattened with Ar ions using the ion guns in this embodiment, a plasma processing mechanism causing the low energy plasma can also be used instead of the ion gun.

After that, the carrier is transported to the sputtering chamber for the free layers. The substrate is heated up to a predetermined temperature by a heat-treatment mechanism to clean the surface and then form CoFe and NiFe layers thereon. Next, a Ta passivation layer is formed in a passivation layer forming chamber to complete MRAM.

The giant magnetoresistive element with a spin valve film (the spin-valve GMR) having a similar construction to MRAM can be manufactured in a similar way. In the case of the film construction shown in FIG. 5($d$), for example, the magnetic characteristics is greatly improved by carrying out plasma processing with an inert gas such as Ar, Ne, Kr, Xe, and the like on each interface of pinned (magnetization) layers of CoFe/Ru/CoFe. That is, the larger MR ratio and the smaller Hin ($<\pm10$ Oe) can be obtained by carrying out plasma processing before the film formation.

For this reason, the rotation cathode unit in a pinned (magnetization) layer sputtering chamber preferably comprises a CoFe target, a Ru target, and an electrode for generating plasma. The plasma processing is, for example, made at a pressure of 0.01–100 Pa by supplying about 0.5 W/cm$^2$ RF power to the electrode and adjusting a bias voltage of substrate to be $-30$ V to 0V.

When the film is formed on one side of substrate, a cluster type apparatus comprising a transfer chamber in which a robot is arranged to transfer substrates and one or more sputtering chambers installed around the transfer chamber may be employed instead of in-line type apparatus having been mentioned so far.

In each process chamber of the cluster type apparatus, the substrate can be rotated while the cathode unit equipped with the target and the surface heating mechanism stands still. In this case, it is desirable to individually attach the rotation mechanism such as a motor to the magnet unit installed behind the target. And any configuration can be employed; for example, one substrate can be placed so that the center of substrate is coincident with or away from the center axis, or one or more substrates can be placed so as to pass below the target and processing mechanism.

Figure 6:
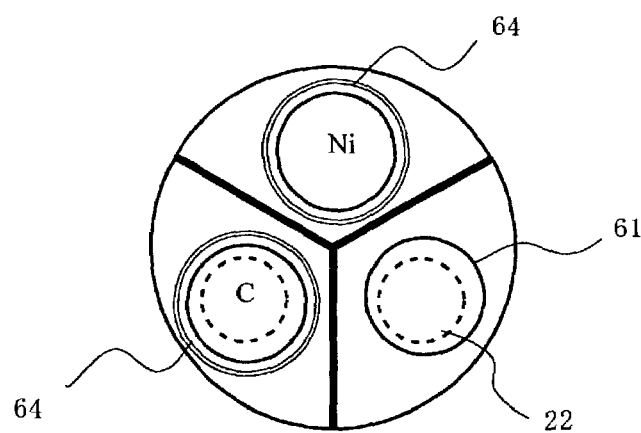
FIG. 6 is a schematic view showing the rotation cathode unit of the fourth embodiment.
Figure 7:
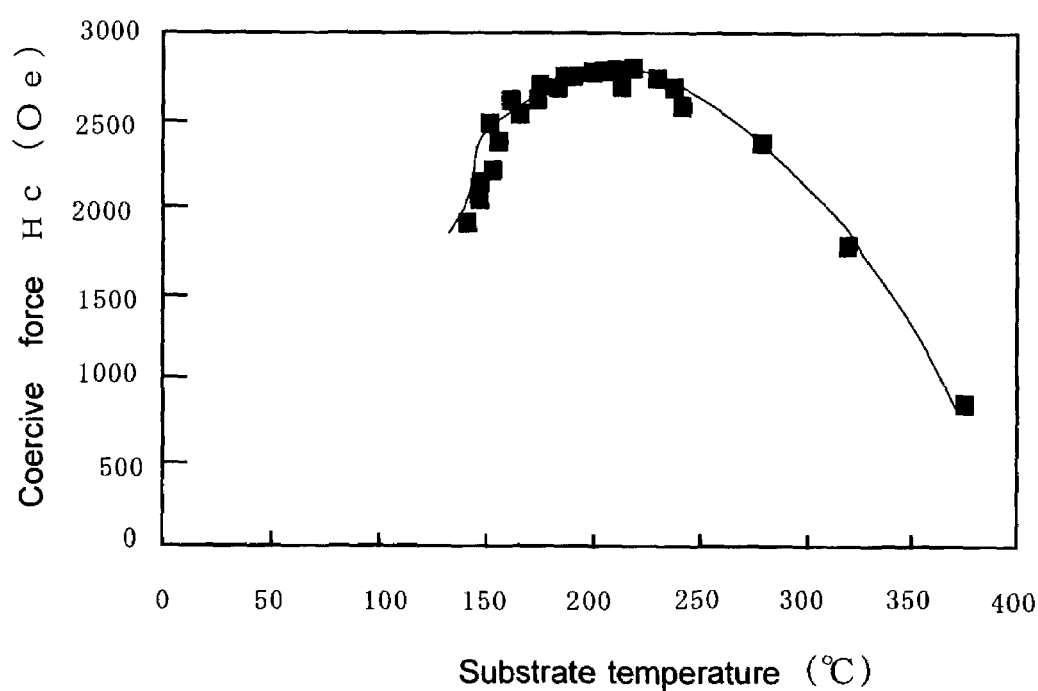
FIG. 7 is a graph showing the relation between the coercive force of the CoCrPt film and substrate temperature.

As the fourth embodiment of this invention, the rotation cathode unit, which is used for manufacturing super lattice films for an X-ray optical element, is shown in FIG. 6.

The configuration of sputtering chamber is the same as shown in FIG. 1 ($a$). However, two silicon substrates are stacked together and held at each substrate holding position of the carrier. Such a configuration improves the productivity. A Ni target and a C target, each of which is equipped with a ring-shaped $N_2$ gas ejection tube 64, and an ion irradiation mechanism 62 are attached on the rotation cathode unit 3.

After the rotation cathode unit is rotated and the substrates are cleaned and flattened with ions, the electric power supply to the ion guns is cut off. Then, Ar and $N_2$ gas are introduced and electric power is simultaneously fed to two targets. The electric discharge is generated to form the multilayer film. Here, a CN layer and a NiN layer, having a thickness of 2.5 nm each, are formed during one revolution of the cathode unit. Therefore, while the cathode is rotated 30 times, the super lattice can be formed which has thirty repetitions of bilayer of NiN (2.5 nm) and CN (2.5 nm).

Super lattice films, such as CrN/CN, CuxN/CN, and VN/CN, are also manufactured similarly by using Cu, Cr or V target instead of Ni target. In these cases, the electric power fed to each target or the rotation speed of rotation cathode unit is adjusted according to the material or thickness of layer to be formed.

In addition, the multilayer film in this invention can be formed not only by the ordinary sputtering using various targets but also by the reactive sputtering using one target and various reactive gases.

The surface processing mechanism of this invention is not limited to the above embodiments. The surface processing mechanism carrying out the surface modification is also available, such as ion implantation, plasma processing mechanism (low energy plasma generator) and the like. Furthermore. in addition to the lamp heater, a planer heating element in which a resistor of, e.g., pyrolytic graphite is formed on a pyrolytic boron nitride (PBN) substrate in various predetermined patterns, a sheath heater, or the like can be employed as a heat treatment mechanism.

Multilayer films, composed of insulator such as aluminum oxide, silicon oxide, silicon nitride or the like, metal film and semiconductor, super lattice films, composed of periodical repetitions of a plurality of layers, and so on are used for magnetic disks, semiconductor integrated circuits, or liquid crystal displays. According to the present invention, each layer can be formed on the clean surface of substrate, underlying film or various films, which make it possible to form multilayer films having excellent characteristics in respective objects. A plurality of targets and surface processing mechanisms can be installed in the same chamber, which provides an apparatus having a high productivity without enlarging its size.

The invention claimed is:

1. A sputtering apparatus comprising:
    a substrate holder holding a substrate or a plurality of substrates,
    a main shaft which holds at least one target and at least one heater, wherein the target and the heater substantially face in a direction of the substrate holder simultaneously,
    a rotation mechanism to rotate said main shaft, and
    means for performing a sputtering process to generate a multilayer film including at least one magnetic layer while using the heater to maintain the substrate within a temperature range of 200° C. to 230° C.

2. The sputtering apparatus according to claim 1, wherein the center of each said substrate is arranged to be located on a circumference so as to overlap with said target when said main shaft is rotated.

3. The sputtering apparatus according to claim 1, wherein the substrate is arranged so that its center coincides with the center of said main shaft, and said target is fixed to be tilted toward the main shaft.

4. The sputtering apparatus according to claim 1, wherein a partition is mounted between said target and said heater.

5. The sputtering apparatus according to claim 2, wherein a partition is mounted between said target and said heater.

6. The sputtering apparatus according to claim 3, wherein a partition is mounted between said target and said heater.

7. The sputtering apparatus according to claim 1, further comprising a magnet unit installed behind said target for generating magnetron electric discharge by forming a magnetic field over a surface of said target, and a rotation mechanism to make said magnetic unit turn on its own axis together with or independently of said main shaft.

8. The sputtering apparatus according to claim 2, further comprising a magnet unit installed behind said target for generating magnetron electric discharge by forming a magnetic field over a surface of said target, and a rotation mechanism to make said magnetic unit turn on its own axis together with or independently of said main shaft.

9. The sputtering apparatus according to claim 3, further comprising a magnet unit installed behind said target for generating magnetron electric discharge by forming a magnetic field over a surface of said target, and a rotation mechanism to make said magnetic unit turn on its own axis together with or independently of said main shaft.

10. The sputtering apparatus according to claim 1, further comprising an ion irradiation mechanism supported by the shaft.

11. The sparing apparatus according to claim 1, wherein the heater is a lamp heater.

12. A thin film forming method for forming a multilayer film including at least one magnetic layer, the method comprising:

fixing at least one target and at least one heater to a platform supported on a main shaft and installing said main shaft in a vacuum chamber, heating a substrate or a plurality of substrates to within a temperature range of 200° C. to 230° C. during rotation of said main shaft, and forming a multilayer film including at least one magnetic layer on the substrate or the plurality of substrates at the temperature range and which are arranged facing the target and said heater during rotation of said main shaft;

wherein the platform is arranged such that both the target and the heater substantially face the substrate or the plurality of substrates.

13. The thin film forming method according to claim 12, wherein the center of each said substrate is arranged to be located on a circumference so as to overlap with said target when said main shaft or said substrate holder is rotated.

14. The thin film forming method according to claim 12, wherein the substrate is arranged so that its center coincides with the center of said main shaft, and said target is fixed to be tilted toward said center of said main shaft.

15. The thin film forming method according to claim 12, wherein a partition is mounted between said target and said heater.

16. The thin fin forming method of claim 12, further comprising carrying out an ion irradiation.

17. The thin fin forming method according to claim 12, wherein the heater is a lamp heater.

* * * * *